US010153742B2

(12) United States Patent
Corbishley

(10) Patent No.: US 10,153,742 B2
(45) Date of Patent: Dec. 11, 2018

(54) ACTIVE RC FILTERS

(71) Applicant: Nordic Semiconductor ASA, Trondheim (NO)

(72) Inventor: Phil Corbishley, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 15/536,504

(22) PCT Filed: Dec. 14, 2015

(86) PCT No.: PCT/GB2015/053971
§ 371 (c)(1),
(2) Date: Jun. 15, 2017

(87) PCT Pub. No.: WO2016/097706
PCT Pub. Date: Jun. 23, 2016

(65) Prior Publication Data
US 2017/0346456 A1    Nov. 30, 2017

(30) Foreign Application Priority Data

Dec. 15, 2014    (GB) .................................. 1422310.1

(51) Int. Cl.
*H03F 3/45*    (2006.01)

(52) U.S. Cl.
CPC ..... *H03F 3/45183* (2013.01); *H03F 3/45188* (2013.01); *H03F 3/45475* (2013.01); *H03F 3/45632* (2013.01); *H03F 2200/18* (2013.01); *H03F 2200/234* (2013.01); *H03F 2200/297* (2013.01); *H03F 2200/453* (2013.01); *H03F 2200/456* (2013.01); *H03F 2200/555* (2013.01); *H03F 2200/75* (2013.01); *H03F 2203/21112* (2013.01); *H03F 2203/21157* (2013.01); *H03F 2203/45036* (2013.01); *H03F 2203/45051* (2013.01); *H03F 2203/45084* (2013.01);
(Continued)

(58) Field of Classification Search
CPC .................................. H03F 3/45; H03F 3/191
USPC .................................................. 330/252, 258
See application file for complete search history.

(56) References Cited

U.S. PATENT DOCUMENTS 3,548,333 A    12/1970  Bakke et al.
4,007,427 A *   2/1977  Leidich ............... H03F 3/45071
                                                        330/257
(Continued)

FOREIGN PATENT DOCUMENTS

GB          2488307 A       8/2012

OTHER PUBLICATIONS

International Search Report and Written Opinion for PCT/GB2015/053971, dated Mar. 7, 2016, 13 pages.
Search Report under Section 17(5) for GB1422310.1, dated Jun. 8, 2015, 4 pages.

*Primary Examiner* — Steven J Mottola
(74) *Attorney, Agent, or Firm* — Klarquist Sparkman, LLP

(57) ABSTRACT

An operational amplifier comprises:
 a first amplifier stage 4 comprising a first differential pair of transistors 8, 10 arranged to receive and amplify a differential input signal 18, 20 thereby providing a first differential output signal 22, 24; and
 a second amplifier stage 6 comprising a second differential pair of transistors 26, 28 arranged to receive and amplify the first differential output signal 22, 24 thereby providing a second differential output signal 38, 40.

12 Claims, 2 Drawing Sheets

Figure 1:
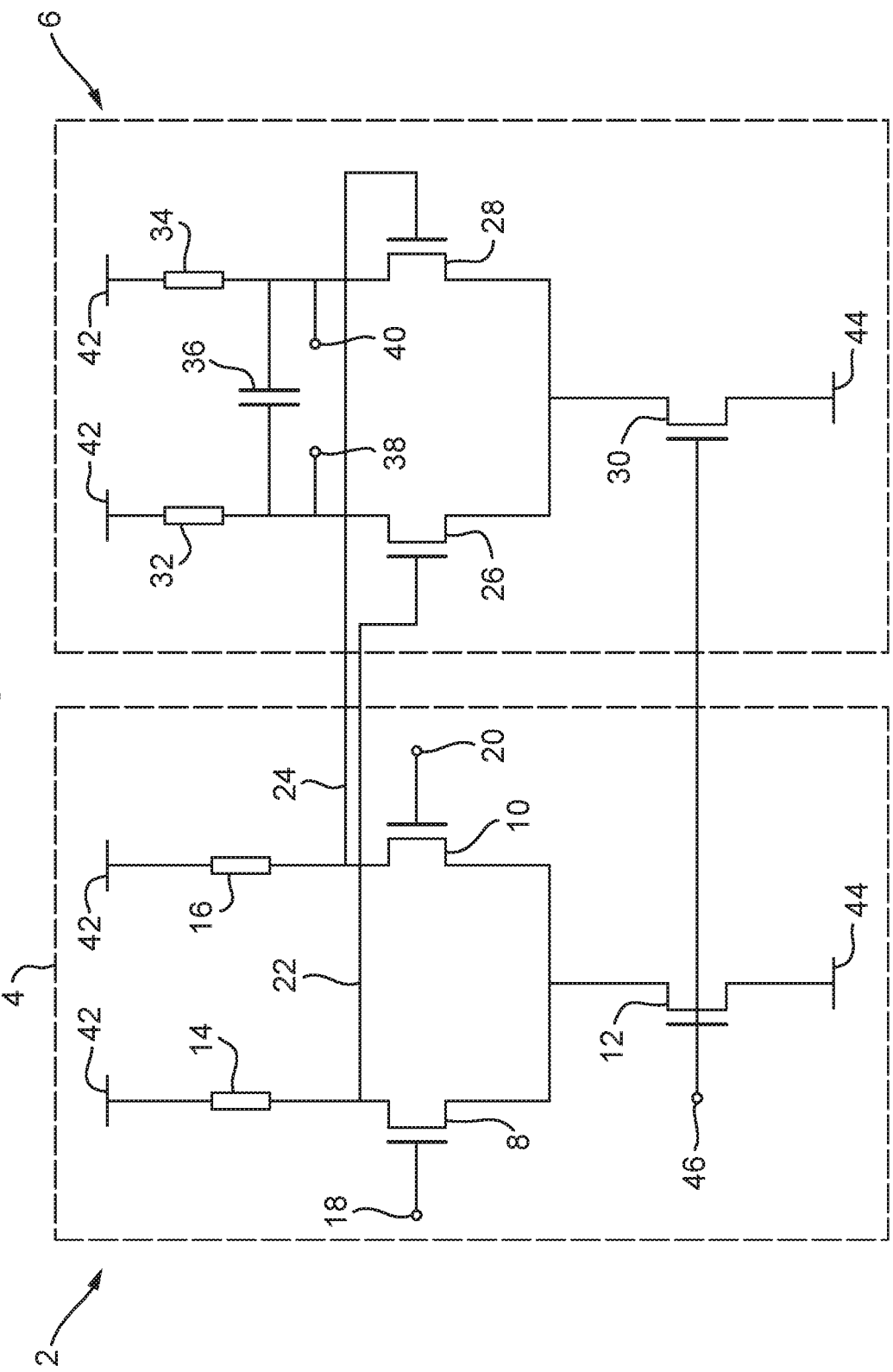

(52) U.S. Cl.
CPC ............. *H03F 2203/45088* (2013.01); *H03F 2203/45101* (2013.01); *H03F 2203/45134* (2013.01); *H03F 2203/45174* (2013.01); *H03F 2203/45201* (2013.01); *H03F 2203/45202* (2013.01); *H03F 2203/45208* (2013.01); *H03F 2203/45264* (2013.01); *H03F 2203/45406* (2013.01); *H03F 2203/45424* (2013.01); *H03F 2203/45434* (2013.01); *H03F 2203/45512* (2013.01); *H03F 2203/45528* (2013.01); *H03F 2203/45562* (2013.01); *H03F 2203/45631* (2013.01); *H03F 2203/45644* (2013.01); *H03F 2203/45652* (2013.01); *H03F 2203/45682* (2013.01); *H03F 2203/45694* (2013.01); *H03F 2203/45702* (2013.01)

(56) References Cited

U.S. PATENT DOCUMENTS

| | | | |
|---|---|---|---|
| 6,081,162 | A | 6/2000 | Johnson |
| 6,121,818 | A * | 9/2000 | Kim ................. H03D 7/1441 327/103 |
| 6,529,048 | B2 | 3/2003 | Zanchi |
| 7,215,199 | B2 | 5/2007 | Marholev |
| 8,222,958 | B2 | 7/2012 | Griffith et al. |
| 8,274,331 | B2 | 9/2012 | Chuang |
| 2004/0066233 | A1 | 4/2004 | Miyagi |
| 2004/0160276 | A1 | 8/2004 | Ikeda et al. |
| 2007/0008035 | A1 | 1/2007 | Liu et al. |
| 2012/0194273 | A1 | 8/2012 | Chuang |
| 2014/0028353 | A1 | 1/2014 | Fan |

* cited by examiner

ACTIVE RC FILTERS

CROSS REFERENCE TO RELATED APPLICATIONS

This is the U.S. National Stage of International Application No. PCT/GB2015/053971,filed Dec. 14, 2015, which was published in English under PCT Article 21(2), which in turn claims the benefit of Great Britain Application No. 1422310.1, filed Dec. 15, 2014. The Great Britain application is incorporated herein by reference in its entirety.

This invention relates to operational amplifiers, particularly those suited for use in active resistor-capacitor (RC) filters.

Active RC filters, usually implemented with an operational amplifier or op-amp, are commonly used analogue filters, particularly when implemented in integrated circuits. Such filters typically exhibit excellent linearity and permit signals with large amplitudes to be utilised. These filters, however, are often limited in performance as there is an inherent propagation delay associated with the op-amp.

In order for an op-amp to be made stable, a technique known as frequency compensation is often used. Frequency compensation involves using feedback to introduce a dominant pole into the transfer function of the system at a frequency just below the frequency associated with the next highest frequency pole. This dominant pole acts so as to reduce the gain of the amplifier to unity, such that the existing pole does not cause large oscillations and system instability when an input frequency lies close to the frequency of the existing pole. However, this frequency compensation technique has an impact on the delay experienced by signals as they propagate through the device.

Feedback loops also tend to require considerable power and as such are not well suited to low power applications such as battery powered portable devices. Such amplifiers also suffer from long start up times and long recovery periods following saturation of the amplifier.

The present invention sets out to provide an alternative approach.

From a first aspect, the invention provides an operational amplifier comprising:
  a first amplifier stage comprising a first differential pair of transistors arranged to receive and amplify a differential input signal thereby providing a first differential output signal; and
  a second amplifier stage comprising a second differential pair of transistors arranged to receive and amplify the first differential output signal thereby providing a second differential output signal.

Thus it will be appreciated by a person skilled in the art that the invention provides an operational amplifier particularly suitable for use in an active RC filter, comprising cascaded amplifier stages, which may each have their own gain and bandwidth characteristics. This operational amplifier can advantageously provide an active RC filter with a low propagation delay, allowing a desired transfer function and low power requirements. This arrangement can also advantageously remove the requirement for common mode feedback associated with implementing active RC filters with conventional operational amplifiers, allowing such a filter to recover from clipping (i.e. when the input signal is amplified to an amplitude larger than the maximum output amplitude) and start up quicker than would be expected with existing filters.

Cascading differential pairs as recited in accordance with the invention is not conventional in the art as it leads to a reduction in gain, and would normally be expected to risk introducing system instability as each of the amplifier stages introduces a 90° phase shift, and so cascading two differential pairs causes a 180° phase shift and thus the potential for undesirable feedback. However, the Applicant has recognised that in the context of an active RC filter application, high gain is not always necessary. The Applicant has further recognised that the potential instability can be addressed or may be tolerable in some circumstances. Thus despite the aforementioned possible drawbacks, the Applicant has appreciated that the benefits associated with the present invention, particularly regarding the possibility of giving low propagation delay and low power consumption, can outweigh them.

Arrangements in accordance with the invention may advantageously allow for the operational amplifier to be implemented with minimal components, thus reducing the physical area required to fabricate it on an integrated circuit. The present invention also permits using components that do not require a large amount of power to operate.

In a set of embodiments, the second amplifier stage comprises one or more components arranged to introduce an additional pole into a transfer function of the operational amplifier. The Applicant has appreciated that adding this frequency compensation to the second differential pair lowers the frequency of the lowest frequency pole associated with the second differential pair without compensation, so as to "spread out" the poles and ensure they do not overlap. In some sets of embodiments, the second amplifier stage comprises a reactive portion comprising at least one capacitor. The capacitor has frequency dependent impedance and so desirably introduces a pole at a lower frequency than the lowest frequency pole associated with the first amplifier stage. Although the capacitor will reduce the bandwidth of the second amplifier stage, it provides additional stability. The reactive portion may comprise a single capacitor or in some circumstances it may be advantageous to use a more complex reactive network. This may provide lead-lag compensation, adding a zero at a lower frequency than the newly introduced pole. This may provide the second amplifier stage with additional bandwidth, which may warrant the additional area required to accommodate it on an integrated circuit. The reactive network may comprise for example a resistor in series with a capacitor, or a capacitor and a resistor in parallel with another capacitor.

In some sets of embodiments, either or both of said first and second amplifier stages comprises a long tailed pair transistor configuration. It is advantageous to utilise a long tailed pair transistor configuration, known in the art per se, in order to provide at least one of the differential amplifier stages. Long tailed pair amplifiers usually consist of a differential pair of transistors, arranged such that their emitters (in the case of bipolar junction transistors or BJTs) or sources (in the case of field effect transistors or FETs) are connected together, and subsequently to ground or to a negative power supply rail via a tail resistor that acts as a constant current source. Either or both differential pairs of transistors may also be connected to ground or to a negative supply rail via one or more current sources. However, in some sets of embodiments, said long tailed pair transistor configurations comprise(s) a tail transistor. The applicant has appreciated that it may be advantageous to utilise a tail transistor in lieu of the tail resistor in some circumstances as it provides the ability to control the current through the long tailed pair, and thus provides a degree of control of any common mode voltage present on the output of the long tailed pair.

The first amplifier stage may be connected to a power supply voltage via a load. In conventional differential amplifier configurations, the aforementioned loads are typically active loads comprising transistors. However, the Applicant has appreciated the advantages in some circumstances of replacing the transistors with resistors. This would not be typical in an amplifier configuration, as the resistors reduce the gain and drive strength. In the context of using the circuit in a filter application however, high gain is not essential, and the fixed resistors provide a linear relationship between a controlled current and the common mode voltage present on the output of the first amplifier stage. In some sets of embodiments therefore, either or both of said first and second amplifier stages are connected to a power supply via a resistor.

In order to control the common mode voltage present on the output of an amplifier stage without the use of feedback, it is desirable in accordance with a set of embodiments to have a local replica of the common mode voltage. A replica circuit comprises components arranged in a similar (but not necessarily identical) way to those in the circuit of which it is designed to replicate provides the ability to model externally a common mode output voltage present in an amplifier stage, and then provide feedforward control to bring said common mode output voltage to a desired level. This provides the ability the control the common mode voltages on numerous amplifier stages simultaneously, preferably using components scaled down to reduce current requirements. In some sets of embodiments, a common mode voltage of at least one of said first and second differential output signals is controlled by a replica circuit that reflects a topology of a one of said first and second amplifier stages. In a set of embodiments, the replica circuit controls the common mode voltage in a plurality of amplifier stages including said first and second amplifier stages.

In some sets of embodiments, the transistors of the first amplifier stage are different to the transistors of the second amplifier stage.

In some sets of embodiments, the first amplifier stage and the second amplifier stage comprise resistors. In some further sets of embodiments, the resistors of the first amplifier stage are different to the resistors of the second amplifier stage.

There are a number of ways of configuring a differential amplifier. In one example a single-ended output is provided wherein the output is an amplified version of the difference between two input signals and is relative to a predetermined value, often ground; this is known in the art as a single-ended amplifier. However, it is often desirable to configure a differential amplifier such that the output is an amplified version of the difference between two input signals but the output floats around a value that is not predetermined; this is known in the art as a fully differential amplifier. Fully differential amplifiers are often useful as they permit the double-ended output of the amplifier to then be used as a double-ended input to a subsequent differential pair. Fully differential amplifiers also provide twice the gain of a single-ended amplifier without the requirement for additional circuitry such as a current mirror as would be needed to provide a similar gain in the case of the latter. In some sets of embodiments, the operational amplifier RC filter is configured as a fully differential amplifier.

There are a number of different transistor technologies that are available for the fabrication of semiconductor devices. However, for low power applications, field effect transistors (FETs) are the most suitable technology due to their low current operating requirements. In some sets of embodiments, the differential amplifier comprises field effect transistors. Thus, when viewed from a second aspect, the invention provides a battery powered integrated circuit that implements an operational amplifier as described above.

The skilled person will appreciate that the operational amplifier of the present invention is particularly suited to use in active RC filters where it is important to minimise both propagation delay and power consumption. Thus when viewed from a third aspect, the invention provides an active RC filter comprising:
  an operational amplifier that comprises:
    a first amplifier stage comprising a first differential pair of transistors arranged to receive and amplify a differential input signal thereby providing a first differential output signal; and
    a second amplifier stage comprising a second differential pair of transistors arranged to receive and amplify the first differential output signal thereby providing a second differential output signal.

The filter may be used to filter a received signal in a radio receiver such as a digital packet radio receiver. A person skilled in the art would appreciate that such a filter comprises a network of resistive and/or reactive components arranged to provide the active RC filter with a desired filtering transfer function. For example the operational amplifier may have at least one capacitor connected between an input of said first amplifier stage and an output of said second amplifier stage.

Figure 2:
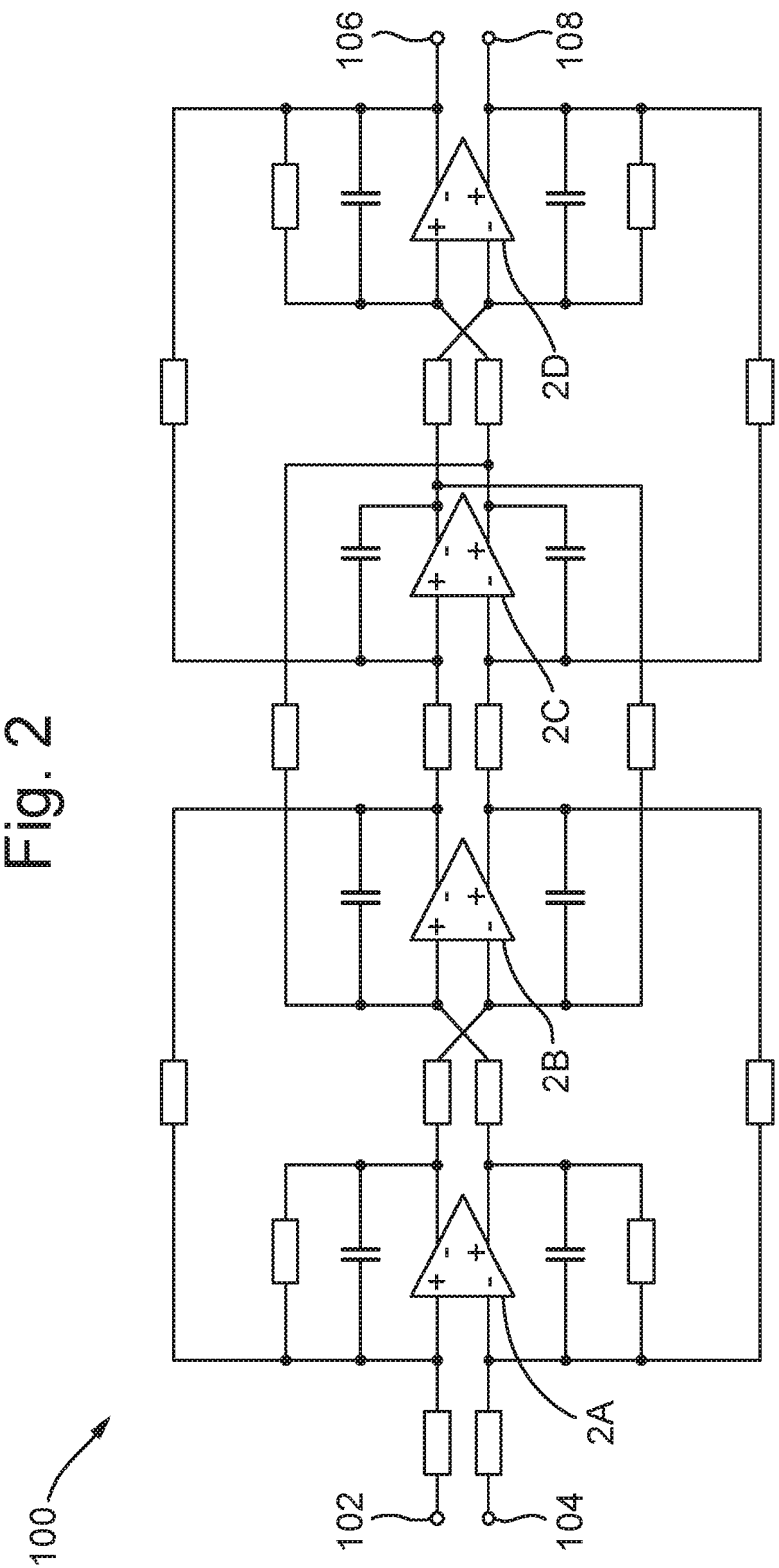

An embodiment of the present invention will now be described, by way of example only, with reference to the accompanying drawings, in which:

FIG. 1 is a circuit diagram of a first exemplary embodiment of the present invention; and FIG. 2 is a circuit diagram of a second exemplary embodiment of the present invention.

FIG. 1 shows a circuit diagram of a first exemplary embodiment of an operational amplifier 2 in accordance of the present invention for use in an active RC filter. The operational amplifier 2 comprises a first amplifier stage 4 and a second amplifier stage 6.

The first amplifier stage 4 comprises a long tailed pair transistor configuration, comprising a differential pair of N-channel field effect transistors 8, 10 and a tail transistor 12. The differential pair of transistors 8, 10 are connected via their respective source leads, and then connected to ground 44 via tail transistor 12. Each differential pair transistor 8, 10 is also connected via its drain lead to the positive power supply 42 via a resistor 14, 16.

The second amplifier stage 6 also comprises a long tailed pair transistor configuration, comprising a differential pair of N-channel field effect transistors 26, 28 and a tail transistor 30. The differential pair of transistors 26, 28 are connected via their respective source leads, and then connected to ground 44 via tail transistor 30. Each differential pair transistor 26, 28 is also connected via its drain lead to the positive power supply 42 via a resistor 32, 34. The drain leads of the transistors 26, 28 are connected to one another via a capacitor 36.

When a differential input 18, 20 is applied to the gate leads of each of the differential pair transistors 8, 10, this drives the differential pair to generate an amplified differential output 22, 24 in the manner known per se to a person skilled in the art. This differential output 22, 24 is then fed as an input to the second amplifier stage 6.

The differential input 22, 24 to the second amplifier stage 6 is applied to the gate leads of each of the differential pair transistors 26, 28, which in turn drives the differential pair to generate an amplified differential output 38, 40. The capacitor 36 acts so as to provide the second amplifier stage 6 with a low pass filter transfer function. With increasing frequency, the impedance of the capacitor 36 decreases, which reduces the amplitude of the second differential output signal 38, 40.

The tail transistors 12, 30 act as a constant current source. The source leads of each of the tail transistors 12, 30 are connected to ground 44, and their respective gate leads are connected to a bias voltage 46. This bias voltage 46 is variable so as to alter the current that flows through each of the amplifier stages 4, 6. This current determines the common mode voltage present on the outputs 22, 24, 38, 40 of each of the amplifier stages 4, 6 due to the resistors 14, 16, 32, 34.

The cascaded amplifier stages operate such that a differential signal input is first amplified by the first amplifier stage 4 to produce an amplified differential output signal. The amplified differential output signal possesses the same frequency and general waveform as the differential input signal, but the amplitude is scaled by a predetermined factor or gain. If the differential signal input is too large in amplitude, such that the amplitude when multiplied by the gain would exceed the maximum output amplitude of the first amplifier stage (primarily dictated by the power supply), clipping occurs, wherein any resulting output amplitude that would exceed this limit is instead output at that limit, resulting in the tops of waveforms being 'cut off'. Once the input signal amplitude returns to a level that does not result in an amplified signal exceeding the output amplitude limit, the output signal returns to following the waveform of the differential input signal.

The above-mentioned signal is then input to the second amplifier stage 6 that filters the amplified differential output signal to produce a filtered amplified differential output signal. The second amplifier stage scales the amplified differential output signal from the first amplifier stage by a factor or gain and produces a filtered amplified output signal with an amplitude that depends on the frequency of the signal, such that signals within a particular range have a larger amplitude than signals in a different range of frequencies.

FIG. 2 shows a circuit diagram of a second exemplary embodiment of the present invention implemented within an active RC filter 100. The active RC filter 100 comprises four operational amplifiers 2A, 2B, 2C, 2D as described with reference to FIG. 1 above.

The active RC filter 100 implements a fourth order leapfrog filter that takes a differential input across two input terminals 102, 104 and provides a differential output across two output terminals 106, 108. A series of resistors and capacitors are arranged to provide feedback loops around the operational amplifiers 2A, 2B, 2C, 2D and thus provide the desired filter transfer function. It will be appreciated by a person skilled in the art that this is only one filter topology and many variations and modifications are possible within the scope of the invention.

Thus it will be seen that an operational amplifier particularly suitable for use within an active RC filter comprising cascaded amplifier stages has been described. Although a particular embodiment has been described in detail, many variations and modifications are possible within the scope of the invention.

The invention claimed is:

1. An operational amplifier comprising:
a first amplifier stage comprising a first differential pair of transistors arranged to receive and amplify a differential input signal thereby providing a first differential output signal; and
a second amplifier stage comprising a second differential pair of transistors arranged to receive and amplify the first differential output signal thereby providing a second differential output signal
wherein a common mode voltage of at least one of said first and second differential output signals is controlled by a replica circuit that reflects a topology of one of said first and second amplifier stages;
wherein the replica circuit controls the common mode voltage in a plurality of amplifier stages including said first and second amplifier stages.

2. The operational amplifier as claimed in claim 1 wherein the second amplifier stage comprises one or more components arranged to introduce an additional pole into a transfer function of the operational amplifier.

3. The operational amplifier as claimed in claim 1 wherein the second amplifier stage comprises a reactive portion comprising at least one capacitor.

4. The operational amplifier as claimed in claim 1 wherein either or both of said first or second amplifier stages comprises a long tailed pair transistor configuration.

5. The operational amplifier as claimed in claim 4 wherein said long tailed pair transistor configuration(s) comprise(s) a tail transistor.

6. The operational amplifier as claimed in claim 1 wherein either or both of said first and second amplifier stages is connected to a power supply via a resistor.

7. The operational amplifier as claimed in claim 1 wherein the transistors of the first amplifier stage are different to the transistors of the second amplifier stage.

8. The operational amplifier as claimed in claim 1 wherein the first amplifier stage and the second amplifier stage comprise resistors, and wherein the resistors of the first amplifier stage are different to the resistors of the second amplifier stage.

9. The operational amplifier as claimed in claim 1 configured as a fully differential amplifier.

10. The operational amplifier as claimed in claim 1 comprising field effect transistors.

11. A battery powered integrated circuit comprising the operational amplifier as claimed in claim 1.

12. An active RC filter comprising:
an operational amplifier that comprises:
a first amplifier stage comprising a first differential pair of transistors arranged to receive and amplify a differential input signal thereby providing a first differential output signal; and
a second amplifier stage comprising a second differential pair of transistors arranged to receive and amplify the first differential output signal thereby providing a second differential output signal
wherein a common mode voltage of at least one of said first and second differential output signals is controlled by a replica circuit that reflects a topology of one of said first and second amplifier stages;
wherein the replica circuit controls the common mode voltage in a plurality of amplifier stages including said first and second amplifier stages.

* * * * *